United States Patent [19]

Gilker

[11] Patent Number: 4,514,685

[45] Date of Patent: Apr. 30, 1985

[54] INTEGRATING CIRCUIT FOR USE WITH HALL EFFECT SENSORS HAVING OFFSET COMPENSATION MEANS

[75] Inventor: Clyde Gilker, South Milwaukee, Wis.

[73] Assignee: Electric Power Research Institute, Inc., Palo Alto, Calif.

[21] Appl. No.: 287,250

[22] Filed: Jul. 27, 1981

[51] Int. Cl.³ .................. G01R 21/08; G01R 19/16; G01R 1/02
[52] U.S. Cl. .............................. 324/142; 324/103 R; 324/111; 324/130
[58] Field of Search .................. 324/103 R, 116, 111, 324/117 H, 142, 130

[56] References Cited

U.S. PATENT DOCUMENTS

| 1,704,520 | 3/1929 | Sommer | 324/103 R |
| 2,615,063 | 10/1952 | Brown | 324/111 |
| 4,200,814 | 4/1980 | Tanaka et al. | 324/117 H |
| 4,283,643 | 8/1981 | Levin | 324/117 H |
| 4,315,212 | 2/1982 | Gamoh | 324/111 |
| 4,351,028 | 9/1982 | Peddie et al. | 324/116 |

Primary Examiner—Ernest F. Karlsen
Attorney, Agent, or Firm—Flehr, Hohbach, Test, Albritton & Herbert

[57] ABSTRACT

An integrating circuit for generating control signals representing watt-hour consumption for connection to an electronic watt-hour meter. The circuit includes a Hall effect sensor for sensing watt-hour consumption, a circuit for integrating the sensed watt-hour consumption, and a circuit for compensating for DC offset voltage generated by the Hall effect sensor.

5 Claims, 6 Drawing Figures

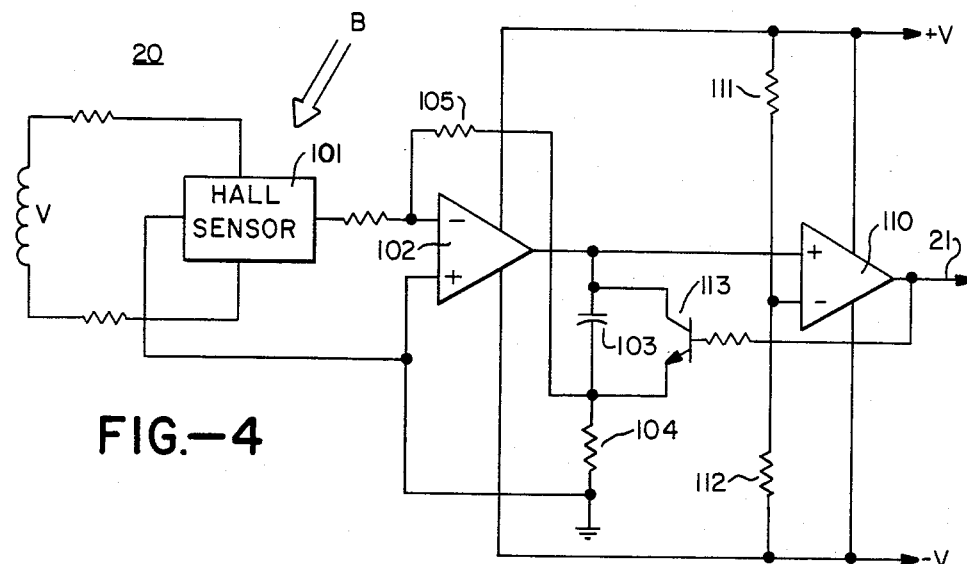
FIG.-4
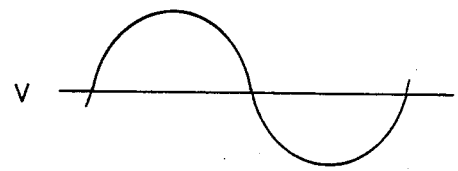
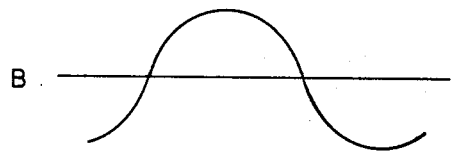
FIG.-5
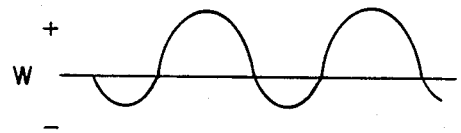
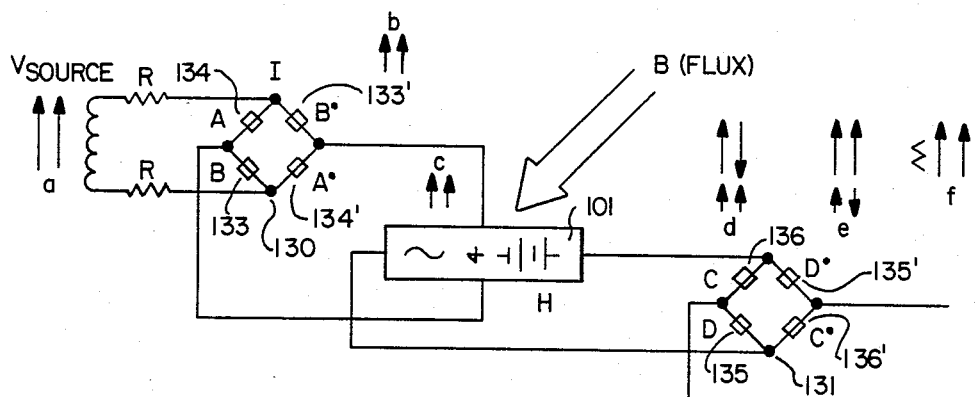
FIG.-6

INTEGRATING CIRCUIT FOR USE WITH HALL EFFECT SENSORS HAVING OFFSET COMPENSATION MEANS

BACKGROUND OF THE INVENTION

The present invention relates to an electronic watt-hour meter and more particularly to an integrating circuit for use with a Hall effect sensor having offset compensation means.

Induction watt-hour meters are currently used for energy measurements and billing purposes at consumers' locations. The induction watt-hour meter (IWM) is a very reliable, accurate and low cost device with a moderate level of security, having a long life and operating accurately over a wide range of temperature and physical conditions.

However, by the nature of its analog register operation, it is an inflexible device that cannot be easily programmed for time of day switching functions and lacks capability for remote communication readout and control.

An alternative approach to the IWM is an electronic watt-hour meter, which utilizes digital logic thereby providing a consumer with a local readout of energy consumption, demand and cost of electric services for the period. A desirable electronic watt-hour meter is described in more detail in the cross-referenced application entitled Electronic Watt-Hour Meter, Serial No. 297,429, filed Aug. 28, 1981, and assigned to the same assignee as the present invention.

In order to implement such an electronic watt-hour meter, it is necessary to provide input control signals which accurately represent watt-hour consumption so that the electronic watt-hour meter can properly perform its assigned functions.

In view of the above background, it is an objective of the present invention to provide an integrating circuit which will generate the necessary input control signals representing watt-hour consumption for connection to an electronic watt-hour meter.

SUMMARY OF THE INVENTION

The present invention relates to an electronic watt-hour meter and more particularly to an integrating circuit for use with a Hall effect sensor having offset compensating means.

According to one aspect of the present invention, the circuit includes means for sensing watt-hour consumption and means for generating a first control signal corresponding to the watt-hour consumption. The circuit also includes means for integrating the first control signal and means for generating second control signals each time that the integrated signal exceeds a predetermined value. The second control signals could be a series of digital pulses each representing a unit of watt-hour consumption for connection to an electronic watt-hour meter.

The integrating circuit could also include a Hall effect sensor for sensing the watt-hour consumption and first and second bridge circuits connected to the Hall effect sensor. The bridge circuits are connected to the Hall sensor for cancelling DC offset voltage signals generated by the Hall effect sensor.

In accordance with the foregoing summary, the present invention achieves the objective of providing an integrating circuit for use with a Hall effect sensor having offset compensation means for generating control signals accurately representing watt-hour consumption for connection to an electronic watt-hour meter.

Other objects and features of the present invention will become apparent from the following detailed description of the invention when taken in conjunction with the accompanying drawings.

DESCRIPTION OF THE DRAWINGS

FIG. 3 depicts a diagram of other embodiments of the electronic watt-hour meter of FIG. 2.

FIG. 4 depicts a more detailed diagram of the watt-hour sensor of FIG. 2.

FIG. 5 depicts a timing diagram for the watt-hour sensor of FIG. 4.

FIG. 6 depicts an off-set compensation circuit for the watt-hour sensor of FIG. 4.

DETAILED DESCRIPTION OF THE DRAWINGS

Figure 1:
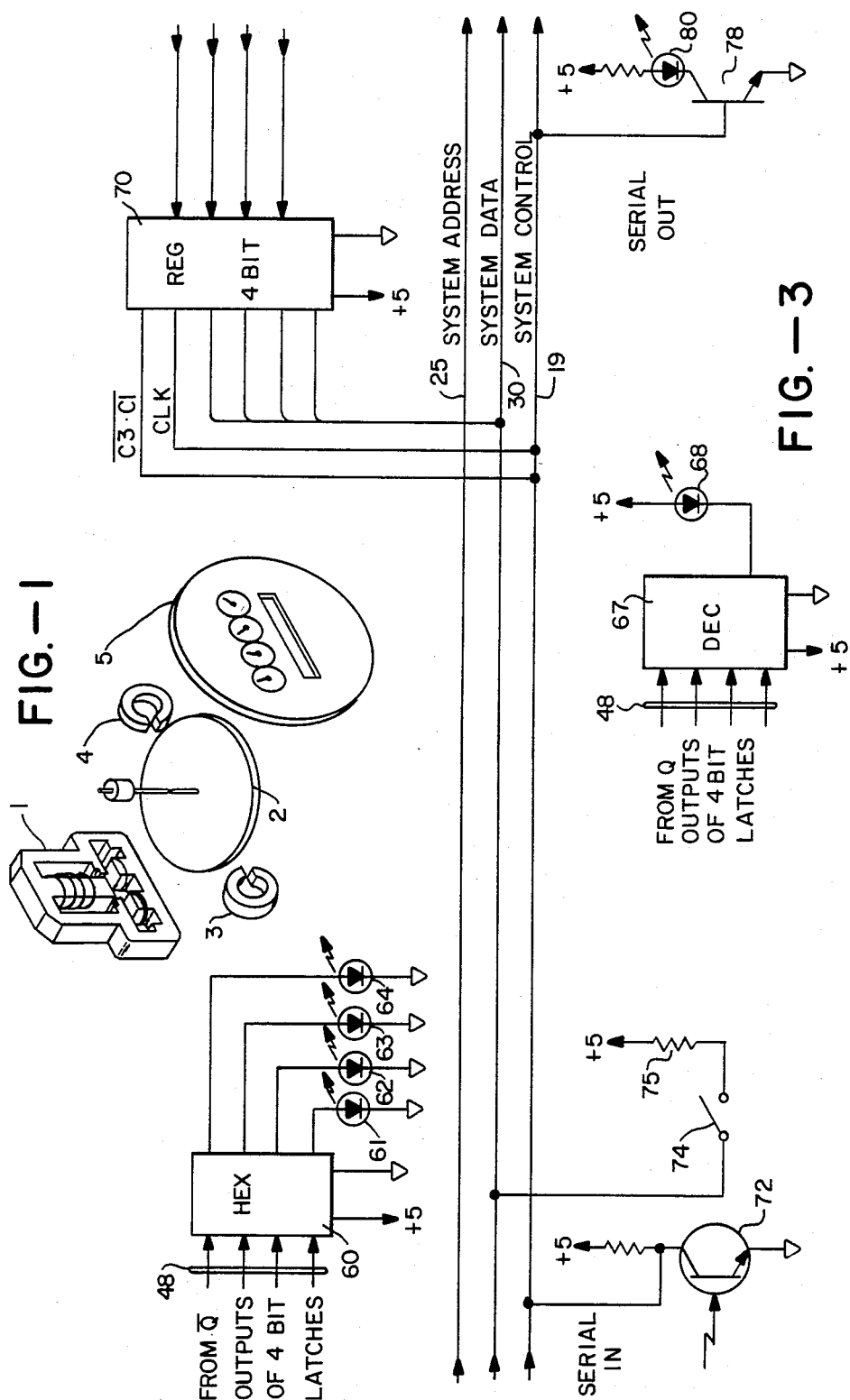
FIG. 1 depicts an exploded diagram of an induction watt-hour meter known in the prior art.

Referring now to the drawings, an induction type watt-hour meter is depicted in FIG. 1, which is the common meter typically found in consumer residences.

In FIG. 1, the potential circuit winding of the stator 1 is made highly inductive to obtain a quadrature-time relationship between the potential-circuit and the current-circuit working fluxes in the disk air gap. These fluxes, displaced in time and space, produce a rotor-disk torque proportional to the circuit power. Retarding magnets 3, 4 control the speed of rotor 2, making it proportional to the power consumed. Register 5, which is geared to rotor 2, records the watt-hours. As described previously, the induction watt-hour meter depicted in FIG. 1 has a long life, operating accurately over a wide range of temperature conditions and is very reliable, accurate, and may be produced at a low cost. However, by the nature of its analog register operation, it is an inflexible device that cannot easily be programmed for time-of-day switching functions and in addition lacks capability for remote communications, readout and control.

Figure 2:
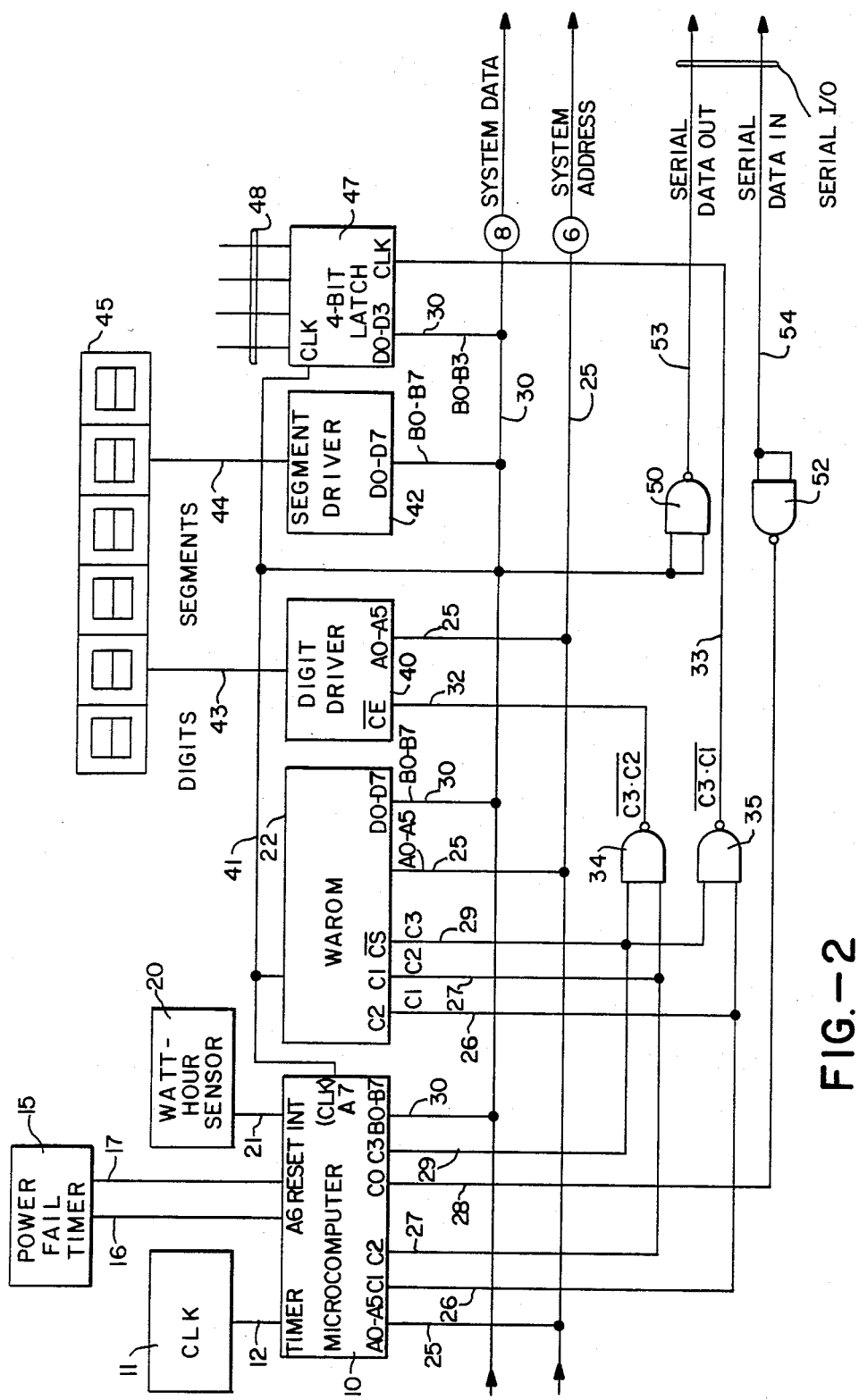
FIG. 2 depicts a block diagram of an electronic watt-hour meter according to the present invention.

Referring now to FIG. 2, a block diagram of an electronic watt-hour meter is depicted and which could be easily adapted to replace the induction watt-hour meter of FIG. 1.

In FIG. 2, the meter includes a watt-hour sensor 20 connected to a microcontroller 10 via bus 21. While sensor 20 could be implemented by punching a hole in rotor 2 of FIG. 1 and including a photo-interrupter module which could then be connected directly to microcontroller 10 of FIG. 2 via bus 21, a preferred implementation of a watt-hour sensor is described in more detail below.

Referring to FIG. 2, sensor 20 generates on bus 21 a series of digital control pulses where each pulse typically represents 7.2 watt-hours, which represents one revolution of rotor 2 of FIG. 1.

In FIG. 2, microcontroller 10 (typically Motorola MC146805) is a processor for controlling the operation of the watt-hour meter and is connected to receive timing signals from clock circuit 11 via bus 12.

Processor 10 is connected to control the remainder of the meter via 8-bit system bus 30, 6-bit system; address bus 25 and control buses 26–29.

System data bus 30 is connected to the B0-B7 pins of processor 10, address bus 25 is connected to the A0-A5 pins of processor 10, and control buses 26-29 are connected to the C0-C3 pins of processor 10.

ROM 22 is a word alterable read only memory (typically General Instruments 2055) connected to system data bus 30, system address bus 25, and control buses 26, 27 and 29. ROM 22 is a 64-byte non-volatile data storage means and is electrically reprogrammable under control of processor 10.

Processor 10 is a complementary metal oxide semiconductor (CMOS) for low power consumption and high noise immunity. Processor 10 includes an internal random access memory (RAM) for scratch pad, register stack during subroutines and interrupts. Processor 10 also includes an internal read only memory (ROM) for programmed storage and has a 1 microsecond (1 us) machine cycle with an instruction set similar to a 6800 microprocessor. Necessary clocking signals from pin A7 of processor 10 are provided on bus 41 for connection to WAROM 22 and latch 47.

A digital display circuit 45 is provided in the watt-hour meter of FIG. 2 in order for a visual display of data, such as watt-hour consumption and costs involved. The digit portion of digital display 45 is enabled by a control signal on bus 43 from digit driver circuit 40 (typically National Semiconductor DS75494) and the segment portion of display 45 is enabled by another control signal on control bus 44 from segment driver 42 (typically DS8867).

Digit driver 40 is connected to receive from processor 10 address signals A0-A5 on bus 25 and an enable signal on bus 32. Digit driver 40 is enabled by processor 10 via the logical NAND of control signal C3 and C2 on buses 29, 27 respectively.

Segment driver 42 receives the appropriate data signals from processor 10 via data bus 30.

Latch circuit 47 (typically Motorola MC14042B) can be connected to control various external power consumption devices via bus 48. The clock signal to latch 47 is generated on bus 33 via the logical NAND in gate 35 of the C3 and C1 control signals on buses 26, 29 from processor 10. The control of external devices can be for such utilities as water heaters, high time of day rate indicators and the like, and which could be devised by one skilled in the art. The latch circuit implementation could be easily removed for additional costs savings, if necessary.

In FIG. 2, power fail timer circuit 15 can be included to provide a means of retaining correct real time information should there be a power failure. It is desirable to provide this capability so that accurate records can be maintained as to power consumption and the like, even in the event of a power failure.

Timer circuit 15 is connected to the A6 input of processor 10 via bus 16 and to the reset input of processor 10 via bus 17 and could provide, for example, six-hour power failure timing signals.

Serial input and/or output of data can be achieved with the present invention via NAND gates 50, 52.

Gate 50 receives the A7 signal on bus 41 and the least significant bit from data bus 30 to provide a serial output format on bus 53. Such an arrangement can be used with an LED and phototransistor (not shown) to couple to a meter reader unit through a glass meter housing which is typically included in an induction watt-hour meter. This type of system could also allow consumer access to selected information, for example, by blocking all light to the phototransistor input to indicate to the IWM that all consumer accessible information should be displayed on the LED readout.

Additionally, the output data (in serial format) on bus 53 could be used to connect to a central monitoring point via commercial telephone lines.

The serial data output on bus 30 is a software convenience in that shift instructions allow simple transfers between the serial bit and the carry flag in the condition code register of processor 10.

Serial data input in the form of control information on bus 54 could be gated through gate 52 to processor 10.

Such an arrangement of serial input/output capabilities can provide remote communications via commercial telephone lines and additionally provide for accurate monitoring by company personnel connecting some type of meter reading device to the watt-hour meter.

A detailed explanation of system addressing and control functions for processor 10 is illustrated as follows in Chart I, where "0" designates a logical "0" state, "1" designates a logical "1" state, and "X" designates a "don't care" state.

CHART I

| C3 | C2 | C1 | A5-A0 | FUNCTION |
|----|----|----|-------|----------|
| 0 | 0 | 0 | X | WRITE DATA INTO WAROM WORD SELECTED BY A0-A5 |
| 0 | 0 | 1 | X | ERASE WAROM WORD SELECTED BY A0-A5 |
| 0 | 1 | 0 | X | READ WAROM WORD SELECTED BY A0-A5 AFTER POSITIVE CLOCK, TRANSITION (A7) |
| 0 | 1 | 1 | X | SAME AS ABOVE |
| 1 | 0 | 0 | X | NEUTRAL |
| 1 | 0 | 1 | X | LATCH ENABLED; DATA ON C0-C3 TRANSFERRED TO EXTERNAL CONTROL OUTPUT AND LATCHED ON SELECTION OF NEXT FUNCTION |
| 1 | 1 | 0 | X | LED DISPLAY ENABLED; SEGMENTS SELECTED BY SYSTEM DATA LINES C0-C7, DIGITS SELECTED BY SYSTEM ADDRESS LINES A0-A5. |
| 1 | 1 | 1 | X | ILLEGAL STATE (LATCH AND DIGIT DRIVER ENABLED) |

Another implementation for the electronic watt-hour meter includes an LED 7 segment display array to communicate power consumption information to the consumer and an LED-phototransistor circuit for bidirectional optically-coupled serial communications to an electronic "meter reader" device. In order to minimize the number of components in the IWM, rather than using a separate LED for serial communications, the consumer 7-segment array could be used to transmit information to the meter reader by turning selected segments on/off to represent serial "1" or "0". Operation of this display of either a 7-segment consumer information display or serial data light transmission source is under software control of processor 10.

The electronic watt-hour meter could be implemented with a minimum number of low cost components in which operation is software programmable, including time of day metering and control calibration, security access, LED multiplexing, serial input/output (I/O) communications, real time clock and the like.

A background real time clock and calendar can be created in software using the internal hardware time of processor 10 with an accurate 60-Hertz power line frequency as a reference input. A wide tolerance range for other system time and requirements eliminates the need for an accurate system clock generator thereby reducing the cost.

Pulses from the watt-hour sensor 20 corresponding to some fixed amount of energy consumption are used to drive an interrupt input of processor 10. An internal flag is set even if the interrupt is masked so that no watt-hour information need be lost. Processing of this watt-hour information is under software control allowing maximum flexibility.

Referring now to FIG. 3, additional embodiments for connection to the electronic watt-hour meter of FIG. 2 are depicted. In FIG. 3, hex buffer 60 (typically 7408) is connected to the Q outputs of the 4-bit latch circuit 47 via bus 48. Buffer 60 is an LED indicator driver for LEDs 61-64, and could operate as a multiple LED indicator driver to simultaneously indicate watt-hour consumption information such as date, kilowatt hours, costs and system diagnostic indications, among other items.

In FIG. 3, decoder 67 (typically 74154 or 74159)could be utilized to receive on bus 48 the Q outputs from latch 47 of FIG. 2. Decoder 67 is a 4:16 decoder and operates as an LED indicator driver of enabling, one at a time, a plurality of LEDs such as represented by LED 68.

Register 70 (typically Motorola MC14076B) could be utilized as an option for latch circuit 47 of FIG. 2. In FIG. 3, an optical input can be implemented via phototransistor 72 to provide, as previously described, serial communications and a consumer activation method.

System diagnostic activation can be achieved in the present invention with the implementation of a switch 74 and resistor 75.

In FIG. 3, another implementation for optical outputs according to the present invention utilizes transistor 78 (typically 2N3904) with LED 80 to provide serial communications with a meter reader. Additionally, an LED display could be utilized.

The watt-hour pulse sensor utilized in the present invention could be, as previously described, a rotating disk with interrupter. However, a desirable implementation would be to utilize a Hall effect device or pulse width modulation device. The requirements for the particular implementation disclosed are a fast CMOS-level pulse where one pulse represents approximately 7.2 watt-hours of consumption.

Referring now to FIG. 4, the watt-hour sensor 20 of FIG. 2 is depicted in more detail, and which includes an integrating circuit for use with a Hall effect sensor to provide a means to integrate watt-hour consumption from the Hall sensor into signals representing watt-hour consumption. The circuit could receive signals from various sensing devices in order to generate control signals representing an input signal vs. time relationship.

As is known in the art, the Hall effect is the development of a transverse electric potential gradient in a current-carrying conductor placed in a magnetic field when the conductor is positioned so that the direction of the magnetic field is perpendicular to the direction of current flow.

In FIG. 4, the symbol V represents the voltage which is input to a Hall sensor device 101. The Hall sensor 101 generates an output signal W which is the product of the voltage V and the magnetic field B, as depicted in FIG. 5.

An operational amplifier 102 in FIG. 4 receives the signal W from the Hall sensing device 101. The output control signal generated by amplifier 102 is integrated by capacitor 103. The voltage across resistor 104 is the feedback signal through resistor 105 which causes operational amplifier 102 to operate in a voltage to current configuration.

Comparator 110 is connected to the output of operational amplifier 102 and capacitor 103. The minus (−) input of comparator 110 is biased to a predetermined level via voltage divider network comprising resistors 111 and 112.

When the charge on capacitor 103 rises to a predetermined level, comparator 110 generates an output pulse on lead 21 which could represent one unit of power measured (e.g., 7.2 watt-hours of consumption). Part of the output pulse signal is applied to transistor 113 which in turn resets capacitor 103 to its initial condition.

The integrating circuit depicted in FIG. 4 is for a system where watts flow "one way," such as in a residential watt-hour meter, so that the charge on capacitor 103 will only increase in a positive manner. However, there are periods of time when the voltage-current product can be negative for more than brief moments, depending upon the power factor (when instantaneous watts could be negative).

If the negative watts must be integrated just after transistor 113 has reset capacitor 103, the charge on capacitor 103 must go negative. The referencing of capacitor 103 to ground and not to −V permits capacitor 103 to charge negative. Since there is not a means of measuring and resetting capacitor 103 from a large negative charge condition, the net watts in the system as shown should always be in a positive direction.

A problem which occurs with Hall sensing devices such as depicted in FIG. 4 is the generation of a DC offset signal by the Hall sensor device itself. Accordingly, it is another feature of the present invention is to provide a means to compensate the offset voltage common in the operation of a Hall effect sensor such as, depicted in FIG. 4.

Referring now to FIG. 6, a Hall effect offset compensation means is depicted for use in the present invention. The offset voltage in a Hall sensor 101, caused by various sources such as strain during manufacture or use, unwanted stray fields, mechanical misalignment during manufacture and the like, appears as a DC voltage added to the desired signal from the Hall sensor.

In FIG. 6, two bridge circuits 130, 131 are provided and are respectively connected to invert the input to the Hall sensor 101 and invert the output of the Hall sensor 101 periodically at a rate asynchronous with the system to be measured, at a 50-50 duty cycle and typically at a rate of transition every 20-30 milliseconds.

In FIG. 6, the lower case letters represent voltages at six positions during operation of the circuit for the two conditions of the bridge circuits 130, 131 (which desirably are configured with CMOS gates). The first condition is for CMOS gates 133, 133' and 135, 135' to be in an "on" condition and all other gates "off". The second condition is for gates 134, 134' and 136, 136' to be on and all other gates "off".

At point "a", of FIG. 6, the voltage signal V is input to the first bridge circuit 130, which generates the inverted signals at point "b" for connection to the Hall sensor device 101. The output of the Hall sensor device 101 at point "d" are input to the second bridge circuit 131, including the unwanted DC offset generated by the Hall effect device 101.

The second bridge circuit 131 generates the output signal at point "e" and at the final summation point "f", the effects of the DC offset bias from Hall sensor 101 have been removed by the cancelling or adding out effect of the first and second bridge circuits 130, 131. Only, the resulting "V" source signal multiplied by the "B" (flux) signal remain, thereby compensating for the unwanted DC offset voltage generated by the Hall sensor device 101.

What is claimed is:

1. In an electronic watt-hour meter, an integrating circuit comprising Hall effect sensor means for sensing watt-hour consumption and for generating a first control signal corresponding to said watt-hour consumption, means for integrating said first control signal, means for generating a second control signal when the integrated signal exceeds a predetermined value, and wherein said Hall effect sensor means include a first and second bridge circuit, said first bridge circuit connected to invert said watt-hour consumption signals for connection to said Hall effect sensor means, said second bridge circuit connected to receive the output of said Hall effect sensor means for inverting said output and for cancelling DC offset voltage signals from said Hall effect sensor means.

2. A circuit as in claim 1 wherein said integrating means include capacitor means for integrating said first control signal from an initial value, comparator means for comparing said integrated signal with said predetermined value, and transistor means for resetting said capacitor means to said initial value when the integrated signal exceeds said predetermined value.

3. A circuit as in claim 2 wherein said means for generating said first control signal include an operational amplifier.

4. An electronic watt-hour meter comprising watt-hour sensor means for generating one or more digital control signals representing watt-hour consumption, memory means for storing first date signals representing said watt-hour consumption, processor means for processing said digital control signals thereby forming first data signals and for controlling the storing of said first data signals in said memory means, said sensor means including Hall effect sensor means for sensing watt-hour consumption, means for generating first control signals corresponding to said watt-hour consumption, means for integrating said first control signals, means for generating a second control signal when each integrated signal exceeds a predetermined value, and wherein said Hall effect sensor means include a first and second bridge circuit, said first bridge circuit connected to invert said watt-hour consumption signals for connection to said Hall effect sensor means, said second bridge circuit connected to receive the output of said Hall effect sensor means for inverting said output and for cancelling DC offset voltage signals from said Hall effect sensor means.

5. A circuit as in claim 4 wherein said integrating means include capacitor means for integrating said first control signal from an initial value, comparator means for comparing said integrated signal with said predetermined value, and transistor means for resetting said capacitor means to said initial value when the integrated signal exceeds said predetermined value.

* * * * *